United States Patent [19]
Hurwitt et al.

[11] Patent Number: 5,879,524
[45] Date of Patent: *Mar. 9, 1999

[54] COMPOSITE BACKING PLATE FOR A SPUTTERING TARGET

[75] Inventors: Steven Hurwitt, Park Ridge, N.J.; Ira Reiss, New City, N.Y.

[73] Assignees: Sony Corporation, Tokyo, Japan; Marerials Research Corporation, Orangeburg, N.Y.

[ * ] Notice: This patent issued on a continued prosecution application filed under 37 CFR 1.53(d), and is subject to the twenty year patent term provisions of 35 U.S.C. 154(a)(2).

[21] Appl. No.: 608,857

[22] Filed: Feb. 29, 1996

[51] Int. Cl.$^6$ ..................................................... C23C 14/34
[52] U.S. Cl. .................................. 204/298.12; 204/298.13
[58] Field of Search ........................ 204/298.12, 298.13, 204/192.12, 298.09

[56] References Cited

U.S. PATENT DOCUMENTS

| | | | |
|---|---|---|---|
| 4,341,816 | 7/1982 | Lauterbach et al. | 204/298.12 |
| 4,476,151 | 10/1984 | Keller et al. | 204/298.12 |
| 5,130,005 | 7/1992 | Hurwitt et al. | 204/192.12 |
| 5,174,875 | 12/1992 | Hurwitt et al. | 204/192.12 |
| 5,282,943 | 2/1994 | Lannutti et al. | 204/298.12 |
| 5,474,667 | 12/1995 | Hurwitt et al. | 204/192.12 |
| 5,522,535 | 6/1996 | Ivanov et al. | 204/298.13 |
| 5,593,082 | 1/1997 | Ivanov et al. | 204/298.12 |
| 5,653,856 | 8/1997 | Ivanov et al. | 204/298.12 |

FOREIGN PATENT DOCUMENTS

| | | | |
|---|---|---|---|
| 1-96375 | 4/1989 | Japan | 204/298.12 |
| 2-301559 | 12/1990 | Japan | 204/298.12 |

*Primary Examiner*—Nam Nguyen
*Assistant Examiner*—Rodney G. McDonald
*Attorney, Agent, or Firm*—Wood, Herron & Evans, L.L.P.

[57] ABSTRACT

A composite backing plate (34) for a backing plate-target assembly (41) having a core of structural material (36) with a front face (42) and/or a rear face (44) of a different material laminated thereto. The composite backing plate (35) has the desired mechanical properties of a solid copper backing plate, for example, strength and stiffness, but is preferably less than half the density of a solid copper backing plate. The core material is preferably aluminum; the front face is preferably copper; and the rear face is preferably either copper or an organic material.

24 Claims, 1 Drawing Sheet

COMPOSITE BACKING PLATE FOR A SPUTTERING TARGET

FIELD OF THE INVENTION

This invention relates generally to the field of cathode sputtering and more particularly, to a target backing plate for use with a sputtering cathode assembly.

BACKGROUND OF THE INVENTION

Cathode sputtering is widely used for the deposition of thin layers of material onto desired substrates. A cathode assembly is mounted in a processing chamber with an anode, and the cathode assembly includes a target which is often attached to a backing plate. The chamber is evacuated and filled with an inert gas, preferably argon. A high voltage electric field is applied across the cathode and the anode. The inert gas is ionized by collision with electrons ejected from the cathode. Positively charged gas ions are attracted to the cathode and, upon impingement with the target surface, dislodge the target material. The dislodged target material traverses the evacuated chamber and is deposited as a thin film on the desired substrate, for example, a wafer, which is located close to the anode.

Referring to FIG. 2, a backing plate-target assembly 10 includes a backing plate 12 upon which is attached a target 14. The target can be fabricated from one of many different materials, for example, silicon, tungsten titanium, nickel, iron, chromium, indium oxide-tin oxide or cobalt, etc. The backing plate-target assembly 10 is attached to a cooling jacket 16 which confines a liquid coolant, for example, water. The coolant enters through a port 20 and flows across the rear surface 22 of the backing plate 12 to extract the heat generated in the target 14 by the sputtering process. The coolant exits through a port 21. The backing plate 12 provides a structural support for the target 14 during handling and use. The backing plate 12 also provides structural support and resistance to bending from both coolant and atmospheric pressure and from thermal stresses imposed by the sputtering process. The backing plate 12 must also provide a thermal path to transfer the heat from the target 14 which is generated by the sputtering process. Several different bonding processes may be used to attach the target 14 to the backing plate 12. Of current interest is the often used process of bonding the target 14 to the backing plate 12 using a low melting point solder alloy which forms a bonding layer 26 between the backing plate 12 and the target 14.

The soldered target and backing plate assembly is then installed in the cathode assembly of the processing chamber. The target is consumed by the sputtering process, and thereafter, the backing plate-spent target assembly must be removed and replaced with a new backing plate-target assembly. In continuous production, the backing plate-target assembly may require replacement after only two days of use. Often, sputtering systems contain four or more cathode assemblies in areas of restricted accessibility. Further, the sputtering system is generally operated in an ultra-clean manufacturing area which precludes the use of mechanical aids such as hoists or forklifts. Therefore, the backing plate-target assembly must be handled manually, and the weight of the backing plate-target assembly is a significant factor in the convenience and speed of the exchange of backing plate-target assemblies in a cathode assembly.

The sputtering process requires that the backing plate have certain properties. First, it should be capable of structurally supporting the target. Second, it should conduct electrical power to the target efficiently, that is, with a low resistance to minimize power loss. Third, the backing plate should be an effective thermal conductor to dissipate and transfer heat from the target. Fourth, the front surface of the backing plate should be readily bondable to numerous different target materials using a low melting point alloy, for example, tin and lead or tin and indium. Fifth, the rear surface of the backing plate exposed to the recirculating coolant should be corrosion resistant. In addition, the backing plate should be easily machinable and reasonable in cost.

A conventional material which provides all of those properties is copper, and copper is often used as a backing plate material to which the target is attached by soldering. The front surface of a copper backing plate is easily wettable with solder and will readily bond solderable target materials. Target materials that are not readily solderable will often have one or more layers of nickel sputtered or plated onto to their backside, and a copper backing plate can be readily soldered thereto. In addition to having all of the above properties, copper is very compatible for use in a vacuum and has sufficient strength and stiffness to avoid bending from either general handling, the thermal stresses of the sputtering process, or the pressure forces of the coolant. Therefore, historically, copper has been considered an almost ideal backing plate material.

There is a continuing effort to improve the yields and efficiencies of the sputtering process, and therefore, over time, the size of the wafer substrates being processed has continuously increased. Currently, wafers of up to 12 in. diameter are being processed, and their size will certainly increase in the future. To accommodate a 12 in. diameter wafer, a backing plate-target assembly must be approximately 18 in. in diameter. To maintain the desired structural integrity, the copper backing plate may be approximately 0.75 in. thick; and given a copper density of approximately 0.323 lb/in$^3$ the copper backing plate will weigh up to 60 pounds. Clearly, in an environment where the backing plate and target assembly must be changed often and generally manually, without the aid of mechanical equipment, a weight of sixty pounds is a severe impediment. Therefore, there is a need for a backing plate that has the desirable properties of copper but does not have the undesirable property of being heavy. There is a need for a light weight copper-like backing plate that can be more easily manually manipulated in and out of the sputtering chamber.

SUMMARY OF THE INVENTION

The present invention provides a backing plate for supporting a target within a cathode assembly that is of a composite and lighter weight construction. The composite backing plate provides many of the desirable mechanical properties of copper, for example, strength and stiffness, but is made with materials that have a density less than copper. Therefore, the composite backplate of the present invention has the advantage of being more easily manually manipulated than previous backing plates made of solid copper material. The present invention further provides a method of manufacturing a composite backplate.

In accordance with the principles of the present invention, a backing plate for supporting a target used in a cathode sputtering process has a composite construction with a structural core material that has a density less than copper. The composite backing plate further has a front face of solderable material and a rear face of corrosion resistant material.

In one aspect of the invention, the core of structural material of the composite backing plate is aluminum and is dissimilar from the material used for at least one of the front and rear faces of the backing plate.

In another aspect of the invention, the front face is a metal layer laminated to the structural core material, and the metal layer of the front face is preferably copper.

In a further aspect of the invention, the rear face of corrosion resistant material is a corrosion resistant metal layer laminated to the structural core material, and the metal layer of the rear face is preferably copper.

In a still further aspect of the invention, the rear face of the corrosion resistant material is an organic material that is preferably applied as a coating to the rear face of the composite backing plate.

In a further embodiment, the invention provides a process of manufacturing a composite backing plate for supporting a target in a cathode sputtering process. The process includes the step of depositing a solderable material onto a front side of opposed front and rear sides of a structural material forming a core of the composite backing plate. The process also includes the step of depositing a corrosion resistant material onto the rear side of the structural material to form a composite backing plate having a structural core with a solderable front face and a corrosion resistant rear face.

These and other objects and advantages of the present invention will become more readily apparent during the following detailed description together with the drawings herein.

DETAILED DESCRIPTION OF THE INVENTION

Figure 1:
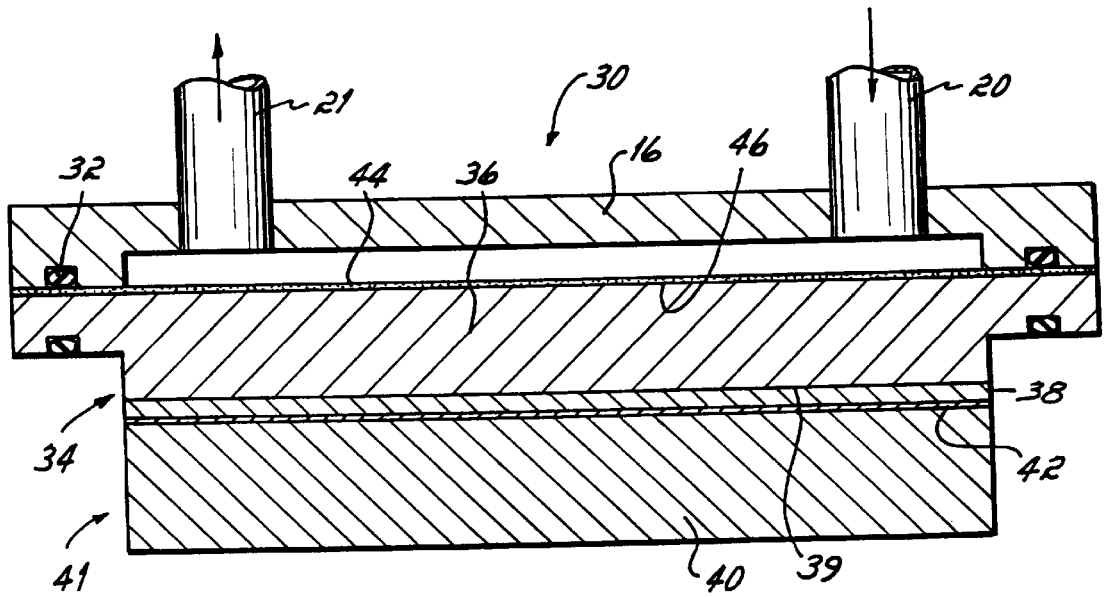
FIG. 1 is a diagram of a composite backing plate in accordance with the principles of the present invention.
Figure 2:
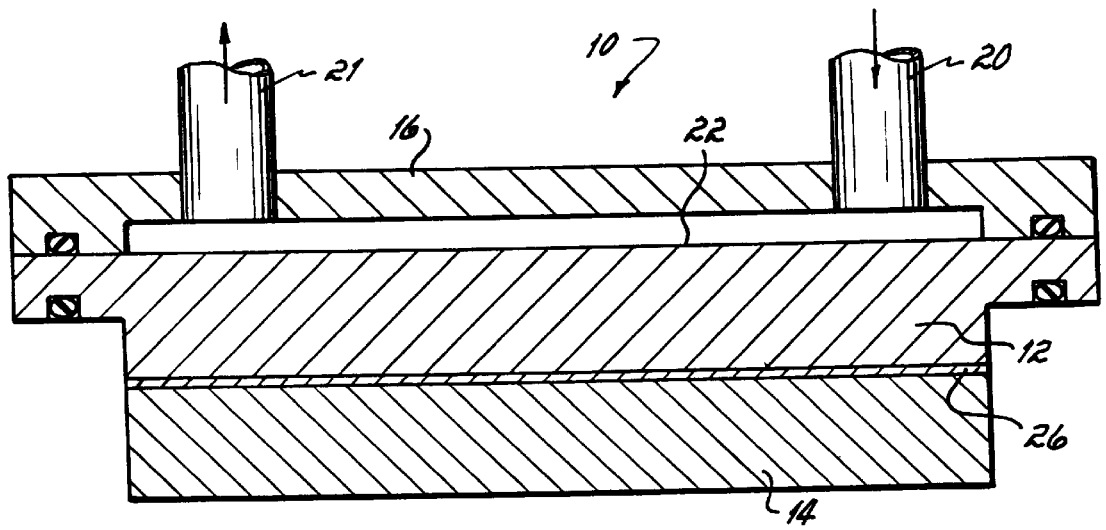
FIG. 2 is a diagram of the prior art construction of a cathode assembly utilizing a solid copper backing plate.

Referring to FIG. 1, a backing plate-target assembly 30 is attached to a cooling jacket 16 in a known manner. O-rings 32 are used to provide a liquid type seal between the backing plate-target assembly 30 and the cooling jacket 16. The backing plate-target assembly 30 includes a composite backing plate 34 comprising, in one embodiment, a core of structural material 36 onto which is laminated to a front face thereof a solderable material 38. The core of structural material 36 should, to the greatest extent possible, have the desired mechanical properties, for example, the strength and stiffness of a solid copper backing plate, but not have the high density of copper. The core of structural material 36 must provide sufficient rigidity and structural support to resist the tendency to bow or bend in response to both the forces of the cooling fluid and the forces created by the thermal stresses caused by the sputtering process. Further, ideally, the core of structural material should have a high thermal conductivity, have a high electrical conductivity, be compatible with a vacuum, be easy to machine, be readily commercially available and be lighter in weight than copper.

A structural material that satisfies many of those characteristics is aluminum which has a density of approximately 0.098 lb/in$^3$, which is roughly one-third that of copper. Therefore, an aluminum backing plate of approximately the same size of a copper backing plate will be approximately one-third the weight of the copper plate. Such an aluminum core will generally range in thickness from approximately 0.25 in. to approximately 1.00 in. In contrast to copper however, aluminum is not naturally corrosion resistant; and further, it is difficult to wet with solder. To overcome the poor solderability of aluminum, a front face material 38 is laminated to the front side 39 of the aluminum core 36. Copper is the preferred front face material 38 and preferably has a thickness in the range of from approximately 0.001 in. to approximately 0.100 in.

A sheet of copper can be laminated to aluminum sheet or plate by any of several known techniques, for example, explosive lamination, high pressure roll lamination, etc. After the copper front face is laminated to the aluminum core, the composite backing plate 34 of the desired size can then be cut from the laminated sheet material. The target 40 is then attached to the copper front face 38, using a low melting point solder alloy in the known manner to form a backing plate-target assembly 41. The solder alloy may be tin and lead or tin and indium and forms a bonding layer 42 having a thickness in the range of from approximately 0.005 in. to approximately 0.030 in. This composite backing plate 34 having an aluminum core 36 and a copper front face 38 has most of the advantages of a solid copper plate.

While the aluminum core 36 has some corrosion resistance, depending upon the cooling fluid used, it may be desirable to provide better corrosion resistant characteristics. Therefore, a rear face 44 of corrosion resistant material may be applied to the rear side 46 of the core of structural material 36. Depending on the corrosion resistant material and the process used to apply it, the rear face 44 may have a thickness in the range of from approximately 0.000001 in. to approximately 0.250 in. The rear face of corrosion resistant material 44 may be a corrosion resistant metal, such as stainless steel, copper, etc. A sheet of the corrosion resistant metal can be laminated to a sheet of the core material 36 by explosive lamination or high pressure roll lamination. A composite backing plate 34 of the desired size is then cut from the laminated sheet material. A rear face of a laminated corrosion resistant metal may have a typical thickness in the range of from approximately 0.005 in. to approximately 0.100 in.; however the laminated metal rear face may generally range in thickness from approximately 0.001 in. to approximately 0.250 in.

An approximately 18 in. diameter composite backing plate having an aluminum core approximately 0.650 in. thick and front and rear laminated copper faces approximately 0.060 in. thick has a composite density of approximately 0.13 lb/in$^3$. Such a composite backing plate will weigh approximately 24 pounds, that is, substantially less than half the weight of a solid copper backing plate, and therefore, is more convenient to manually handle. That lighter weight has the advantage of making the exchange of backing plates-target assemblies easier and quicker with less potential of damage to the assembly and the associated equipment.

Alternatively, the rear face of corrosion resistant material 44 may be a corrosion resistant metal, such as, nickel, chromium, etc., which is applied to the core material 36 by a plating process, for example, by electroplating. A rear face of a plated corrosion resistant metal may have a typical thickness in the range of from approximately 0.0001 in. to approximately 0.005 in.; however it may range in thickness from approximately 0.00005 in. to approximately 0.015 in.

A third construction of the rear face 44 of corrosion resistant material is an organic coating. Any organic coating that provides good corrosion resistance and can be applied to the core material 36 may be used. For example, a thermally conductive epoxy or waterproof paint may be sprayed onto the rear side 46 of the aluminum core 36, or, a "TEFLON" polytetrafluoroethylene coating may be applied to the rear side 46. Such an organic coating would typically have a thickness in the range of from approximately 0.002 in. to approximately 0.004 in.; however it may range in thickness from approximately 0.001 in. to approximately 0.010 in.

With a fourth construction, the rear face 44 may be a corrosion resistant chemical compound that is applied by anodizing the rear side 46 of the aluminum core 36 or, by depositing a coating of titanium nitride or silicon nitride thereon. Such an anodized or deposition layer would typically have a thickness in the range of from approximately 0.00001 in. to approximately 0.005 in.; however it may range in thickness from approximately 0.000001 in. to approximately 0.025 in.

By utilizing a corrosion resistant coating as the rear face 44 of the composite backing plate 34, a backing plate is provided that has essentially all of the desired characteristics of copper but is substantially lighter in weight than copper. It should be noted that it is not necessary for the rear face 44 to be electrically conductive. The cooling jacket 16 is preferably made from an electrically conductive material and is mechanically coupled to the backing plate core material 36 by a bolt ring or other fasteners (not shown) located adjacent the seals 32. Therefore, even though the rear face 44 is not an electrical conductor, the composite backing plate 34 can still function to conduct electricity to the target.

In use, a composite backing plate weighing approximately 24 pounds can be manually lifted and manipulated relatively easily by a single person having average strength characteristics. In contrast, the previous solid copper backing plate, weighing approximately 60 pounds, can only be manipulated by a single person having above average strength, and even then with great difficulty. Therefore, the composite backing plate 34 as described herein provides for a more convenient and efficient exchange of backing plate-target assemblies. Further, with the lighter composite backing plate, the exchange may be conducted with less probability of the backing plate being dropped, thereby reducing the probability of damage to the backing plate-target assembly and its associated equipment.

While the invention has been set forth by a description of the preferred embodiment in considerable detail, it is not intended to restrict or in any way limit the claims to such detail. Additional advantages and modifications will readily appear to those who are skilled in the art. For example, FIG. 1 illustrates a composite backing plate having front and rear face materials 42, 44 of a different material from the core material 36. If the core material 36 has either the desired bondability on its front side or the desired corrosion resistance on its rear side, only one of the front and rear face materials 42, 44 may be a different material from the core structure 36. The various diameters and thicknesses of the structural core, the front and rear faces and the whole composite backing plate are only illustrative provided by way of example. The actual sizes and thicknesses of those various component parts will be a function of the available equipment, the application, etc.

The invention, therefore, in its broadest aspects, is not limited to the specific detail shown and described. Consequently, departures may be made from the details described herein without departing from the spirit and scope of the claims which follow:

What is claimed is:

1. A backing plate having a composite construction and adapted to support a target used in a cathode sputtering process, the target being bonded to the backing plate by an intermediate solder layer, the backing plate comprising:
    a core of structural material having a density less than copper;
    a front face of copper having a thickness in the range of from approximately 0.001 inches to approximately 0.100 inches, the front face adapted to receive the solder layer for securing the target to the front face; and
    a rear face of corrosion resistant material.

2. The composite backing plate of claim 1 wherein the core of structural material is aluminum.

3. The composite backing plate of claim 2 wherein the core of structural material is aluminum having a thickness in the range of from approximately 0.250 inches to approximately 1.00 inches.

4. The composite backing plate of claim 1 wherein the front face of copper is laminated to the core of structural material.

5. The composite backing plate of claim 1 wherein the rear face of corrosion resistant material is a corrosion resistant metal layer laminated to the core of structural material.

6. The composite backing plate of claim 5 wherein the metal layer of the rear face has a thickness in the range of from approximately 0.001 inches to approximately 0.250 inches.

7. The composite backing plate of claim 5 wherein the metal layer of the rear face is copper.

8. The composite backing plate of claim 1 wherein the rear face of corrosion resistant material is a corrosion resistant metal layer plated to the core of structural material.

9. The composite backing plate of claim 8 wherein the metal layer of the rear face has a thickness in the range of from approximately 0.00005 inches to approximately 0.015 inches.

10. The composite backing plate of claim 1 wherein the rear face of corrosion resistant material is an organic material.

11. The composite backing plate of claim 10 wherein the organic material is a coating applied to the rear face of the composite backing plate.

12. The composite backing plate of claim 11 wherein the organic coating of the rear face has a thickness in the range of from approximately 0.001 inches to approximately 0.010 inches.

13. The composite backing plate of claim 1 wherein the rear face of corrosion resistant material is a nonorganic material.

14. The composite backing plate of claim 13 wherein the nonorganic material is a coating deposited on the rear face of the composite backing plate.

15. The composite backing plate of claim 14 wherein the nonorganic coating of the rear face has a thickness in the range of from approximately 0.000001 inches to approximately 0.025 inches.

16. The composite backing plate of claim 15 wherein the nonorganic coating of the rear face is titanium nitride.

17. The composite backing plate of claim 15 wherein the nonorganic coating of the rear face is silicon nitride.

18. The composite backing plate of claim 15 wherein the nonorganic coating of the rear face is an anodized layer.

19. A composite backing plate adapted to support a target in a cathode sputtering process, the target being bonded to the backing plate by an intermediate solder layer, the backing plate comprising:
    an aluminum core;
    a copper front face having a thickness in the range of from approximately 0.001 inches to approximately 0.100 inches, the front face adapted to receive the solder layer for securing the target to the front face; and a copper rear face.

20. A composite backing plate adapted to support a target in a cathode sputtering process, the target being bonded to the backing plate by an intermediate solder layer, the backing plate comprising:

an aluminum core;

a copper front face having a thickness in the range of from approximately 0.001 inches to approximately 0.100 inches, the front face adapted to receive the solder layer for securing the target to the front face; and an organic material rear face.

21. A composite backing plate for supporting a target in a cathode sputtering process, the target being bonded to the backing plate by an intermediate solder layer, the backing plate comprising:

an aluminum core;

a copper front face having a thickness in the range of from approximately 0.001 inches to approximately 0.100 inches, the front face adapted to receive the solder layer for securing the target to the front face; and a nonorganic material rear face.

22. The composite backing plate of claim 21 wherein the nonorganic material is titanium nitride.

23. The composite backing plate of claim 21 wherein the nonorganic material is silicon nitride.

24. The composite backing plate of claim 21 wherein the nonorganic material is an anodized layer.

* * * * *